(12) United States Patent
Stahr et al.

(10) Patent No.: US 8,500,938 B2
(45) Date of Patent: Aug. 6, 2013

(54) METHOD FOR PRODUCING A FLEXI-RIGID PRINTED CIRCUIT BOARD AND FLEXI-RIGID PRINTED CIRCUIT BOARD

(75) Inventors: Johannes Stahr, Bruck (AT); Markus Leitgeb, Trofaiach (AT)

(73) Assignee: AT & S Austria Technologie & Systemtecknik Aktiengesellschaft, Leoben-Hinterberg (AT)

(*) Notice: Subject to any disclaimer, the term of this patent is extended or adjusted under 35 U.S.C. 154(b) by 892 days.

(21) Appl. No.: 12/449,608

(22) PCT Filed: Jan. 30, 2008

(86) PCT No.: PCT/AT2008/000030
§ 371 (c)(1),
(2), (4) Date: Aug. 17, 2009

(87) PCT Pub. No.: WO2008/098272
PCT Pub. Date: Aug. 21, 2008

(65) Prior Publication Data
US 2010/0025086 A1    Feb. 4, 2010

(30) Foreign Application Priority Data
Feb. 16, 2007  (AT) .................................. GM99/2007

(51) Int. Cl.
*H05K 1/00*  (2006.01)
*B32B 38/04*  (2006.01)

(52) U.S. Cl.
USPC ........ 156/256; 156/307.7; 156/310; 156/314; 156/273.3; 174/254

(58) Field of Classification Search
USPC ................... 174/254; 156/256, 307.5, 307.7
See application file for complete search history.

(56) References Cited

U.S. PATENT DOCUMENTS

| | | | | |
|---|---|---|---|---|
| 4,931,134 A | * | 6/1990 | Hatkevitz et al. | 216/17 |
| 5,004,639 A | * | 4/1991 | Desai | 428/138 |

(Continued)

FOREIGN PATENT DOCUMENTS

| | | |
|---|---|---|
| DE | 40 03 344 C1 | 6/1991 |
| DE | 202 21 121 U1 | 3/2005 |

(Continued)

OTHER PUBLICATIONS

International Search Report Dated Jun. 25, 2008.

*Primary Examiner* — Timothy Thompson
*Assistant Examiner* — Hiram E Gonzalez
(74) *Attorney, Agent, or Firm* — Jacobson Holman PLLC

(57) ABSTRACT

The invention relates to a method for producing a flexi-rigid printed circuit board, at least one rigid zone (1, 17, 18) of a printed circuit board being connected via a layer of non-conducting material or a dielectric layer (13, 15) to at least one flexible zone (7) of the printed circuit board, the at least one rigid zone being connected to the flexible zone (7) of the printed circuit board, the rigid zone (1) of the printed circuit board then being cut through and a connection between the separate, rigid partial zones (17, 18) of the printed circuit board being established via the flexible zone (7) that is connected thereto. According to the invention, the connection between the at least one rigid zone (1, 17, 18) of the printed circuit board and the at least one flexible zone (7) of the printed circuit board is established by bonding prior to cutting the rigid zone. The invention also relates to a flexi-rigid printed circuit board of the above type which allows increased registration accuracy and is easy to produce and has a reduced layer thickness of the connection (15) between the at least one rigid zone (1, 17, 18) and the flexible zone (7) of the printed circuit board.

15 Claims, 3 Drawing Sheets

U.S. PATENT DOCUMENTS

| | | | |
|---|---|---|---|
| 5,142,448 A * | 8/1992 | Kober et al. | 361/751 |
| 5,144,534 A * | 9/1992 | Kober | 361/751 |
| 7,238,891 B2 * | 7/2007 | Muenzberg | 174/255 |

FOREIGN PATENT DOCUMENTS

| | | | |
|---|---|---|---|
| DE | 202 21 189 U1 | 5/2005 | |
| JP | 4213888 A | 8/1992 | |
| JP | 5075271 A | 3/1993 | |
| JP | 6252552 A | 9/1994 | |
| JP | 10022645 A | 1/1998 | |
| JP | 10173342 A | 6/1998 | |
| JP | 2005539399 A | 4/2004 | |

* cited by examiner

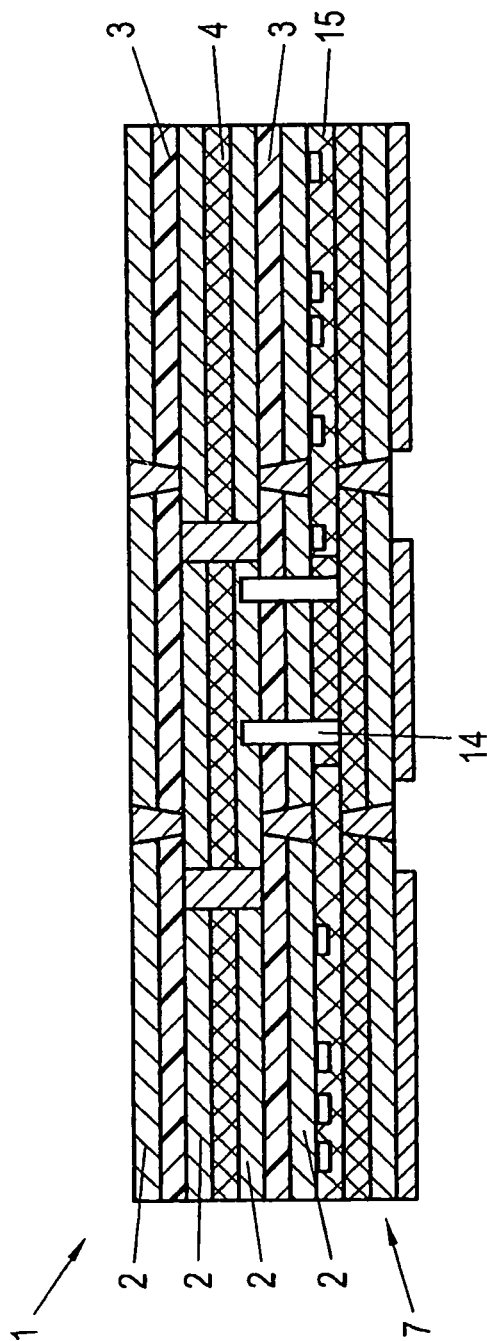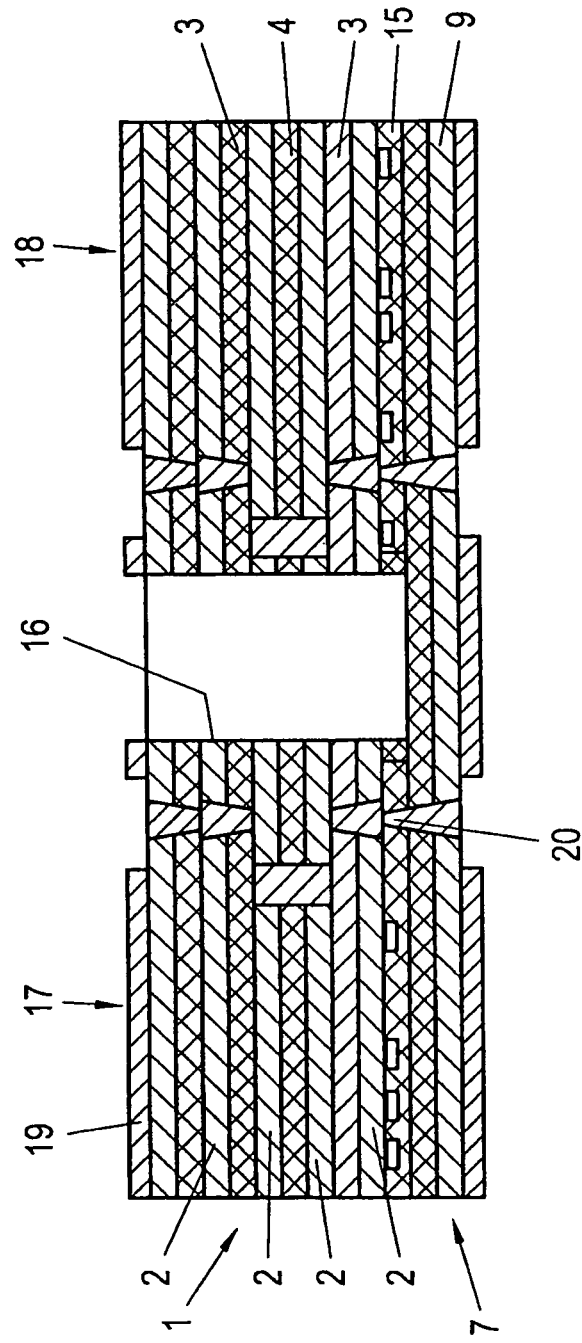

METHOD FOR PRODUCING A FLEXI-RIGID PRINTED CIRCUIT BOARD AND FLEXI-RIGID PRINTED CIRCUIT BOARD

This is a national stage of PCT/AT08/000,030 filed Jan. 30, 2008 and published in German, which has a priority of Austria no. GM 99/2007 filed Feb. 16, 2007, hereby incorporated by reference.

FIELD OF THE INVENTION

The present invention relates to a method for producing a rigid-flexible circuit board, wherein at least one rigid portion or zone of a printed circuit board is connected with at least one flexible portion or zone of the printed circuit board via a layer of non-conductive material or dielectric layer, wherein, after having connected the at least one rigid and flexible portions of the circuit board, the rigid portion of the circuit board is divided and a connection between the mutually separated rigid subportions or partial zones of the circuit board is produced via the flexible portion connected therewith, wherein the connection between the at least one rigid portion of the circuit board and the at least one flexible portion of the circuit board is realized by an adhesion prior to dividing the rigid portion. The invention further relates to a rigid-flexible circuit board, wherein at least one rigid portion or zone of a printed circuit board is connected with at least one flexible portion or zone of the printed circuit board via a layer of non-conductive material or dielectric layer, wherein, with the at least one rigid and flexible portions of the circuit board having been connected, the rigid portion of the circuit board is divisible and a connection between the mutually separated rigid subportions or partial zones of the circuit board is producible via the flexible portion connected therewith, wherein a connection between the at least one rigid subportion of the circuit board and the at least one flexible portion of the circuit board is comprised of at least one adhesive layer.

PRIOR ART

The design of electronic components, which has increased in complexity during the past years, has generally led to an increase in the number of connection points between active components and components of a printed circuit board, wherein the increasing reduction of size has, at the same time, entrained a reduction of the distance between such connection points. In the context of the production of printed circuit boards, the disentanglement of such component connection points by microvias through several circuit board layers in so-called high density interconnects (HDI) has been proposed.

In addition to an increase in the complexity of the design and construction of printed circuit boards and the miniaturization involved, further requirements with a view to providing foldable or bendable connections in a circuit board have come up, which have led to the development of a hybrid technology and the use of so-called rigid-flexible circuit boards. Such rigid-flexible circuit boards comprising rigid portions or subportions or zones of the circuit board as well as flexible portions or zones connecting such rigid portions, have enhanced reliability, offered other or additional options of freedom in terms of design and construction, and enabled further miniaturization.

For the production of such rigid-flexible circuit boards or flexi-rigid printed circuit boards, connection layers corresponding with the rigid and flexible portions of a circuit board and made of dielectric materials are to be provided between said portions, whereby the arrangement of appropriate leaf-shaped layers or films which, for instance by heat treatment, cause the connection of circuit board rigid and flexible portions to be connected will usually result in comparatively thick layers. Such thick layers not only counteract the intended miniaturization in the fabrication of multilayer circuit boards, but also entail losses of the registering accuracy required for subsequent laser borehole geometries for the formation of microvias and accordingly narrowly spaced-apart connection sites. Such thick, known layers of non-conductive materials, or dielectric layers, moreover, involve additional processing or process steps and/or more complex designs for the production of the connections required between the rigid and flexible portions of circuit boards.

From DE 202 21 121 U1 and DE 202 21 189 U1 there can each be taken a circuit board of the kind mentioned above with at least one rigid portion or zone and a flexible portion or zone, wherein an adhesion is provided between layers of the rigid and flexible portions, wherein it is aimed at providing a simple and cheap production.

SUMMARY OF THE INVENTION

The present invention aims to further develop both a method of the initially defined kind and a circuit board of the initially defined kind to the effect that a simplified method is provided for the production of rigid-flexible circuit boards for highly complex electronic components, wherein it is, moreover, aimed to make the layers of non-conductive materials, or dielectric layers, between the individual rigid and flexible portions of the circuit board thinner, as opposed to known configurations. Furthermore, it is aimed to improve processing or working in further steps, for instance, by an elevated registering accuracy.

To solve these objects, a method of the initially defined kind is essentially characterized in that an adhesive layer is applied in the region of the subsequent division of the rigid portion of the circuit board, which adhesive layer is subjected to complete curing, whereupon, adjacent to the partially applied and completely cured adhesive layer, a further adhesive layer is applied onto the rigid portion of the circuit board, which further adhesive layer is subsequently only partially cured, and that, after the partial curing of the second or adjacent adhesive layer, the rigid portion of the circuit board is connected with the flexible portion of the circuit board via the interposed adhesive layer by the subsequent complete curing of the second adhesive layer. Due to the fact that instead of using the hitherto known leaf-shaped or sheet-like films for connecting rigid and flexible portions or zones of a circuit board, the connection of such rigid and flexible portions of the circuit board is realized by an adhesion, the limitations in respect to the required registering accuracy of the layer of non-conductive material, or dielectric layer, to be provided between the rigid and flexible portions of the circuit board, in particular with a view to further processing, are obviated since the adhesive forming the adhesion can be directly applied on the rigid portion of the circuit board by simple method steps and with an accordingly high accuracy, whereupon a reliable connection can be produced in a simple manner by fixing the flexible circuit board layer to the rigid circuit board portion provided with the adhesive. By the use of an adhesive for producing a connection between at least one rigid and at least one flexible portion of the circuit board, as proposed by the invention, it is, moreover, feasible to do with thinner layer thicknesses for the non-conductive material or dielectric layer so as to achieve further advantages in the sense of a further miniaturization and a reduction of the overall thickness of the rigid-flexible circuit board to be produced according to the invention. Due to the fact that, according to the invention, the adhesive layer applied in the region of the subsequent division in a first process step is completely cured, a connection with the flexible portion of the circuit board to be connected therewith will subsequently be avoided such that, in the subsequent step of dividing the rigid portion of the circuit board without any extremely precise adjustment of the depth of division, the adhesive layer just connected with the part of the rigid portion of the circuit board to be removed, which adhesive layer has been applied in a first method step and cured completely, will be immediately removed. For the subsequent division, it must therefore only be taken care that the dividing tool will reliably divide the rigid portion of the circuit board completely, wherein an accordingly precise adjustment of the cutting or dividing depth tuned to the thickness of the adhesive layer is, moreover, not necessarily required. A reliable connection of the rigid portions of the circuit board remaining after the division, with the flexible portion of the circuit board to be connected therewith is effected via the second adhesive layer to be applied in a second adhesive applying step, which second adhesive layer is only partially cured in the beginning such that, after the fixation of the flexible portion of the circuit board, a reliable connection between the rigid portion of the circuit board and the flexible portion of the circuit board will be achievable in a subsequent curing step preceding the subsequent separating step. The adhesive applied in the first adhesive applying step in the region of the subsequent division, after complete curing will, moreover, prevent flowing of the subsequently applied, second adhesive layer bordering the first adhesive layer, in particular, during the complete binding of the rigid portion of the circuit board with the flexible portion of the circuit board.

For a particularly simple and reliable application of the adhesive for producing the adhesion between the at least one rigid and at least one flexible subportions of the rigid-flexible circuit board to be produced according to the invention, it is proposed according to a preferred embodiment that the adhesion between the rigid and flexible portions of the circuit board is made using a printable adhesive. Such a printable adhesive can be accordingly precisely applied, in the desiredly thin layer thickness, on the rigid portion to be subsequently connected with a flexible portion of the circuit board.

As already mentioned above, it is feasible by the adhesion provided according to the invention between the at least one rigid portion of the circuit board and the flexible subportion, to do with accordingly reduced layer thicknesses, wherein, according to a further preferred embodiment, it is proposed in this context that the layer thickness of the adhesion is chosen to be smaller than 50 µm and, in particular, smaller than 40 µm.

In order to enable reliable processing involving few operating steps for the production of the connection between the rigid portion of the circuit board and the flexible portion of the same, it is proposed according to a further preferred embodiment of the invention that a one-or multi-component thermosetting cross-linking adhesive is used. In this context, it has turned out to be particularly preferred, also in consideration of subsequent processing steps, that the adhesive is selected on the basis of epoxides, polyimides, phenol resins or mixtures thereof, optionally in combination with curing systems based on hydroxyl-, thiol- or amino-functional cross-linking groups.

In order to achieve the desired workability or processability of the adhesive used for the formation of the adhesion according to the invention between the rigid portion of the circuit board and the flexible portion of the same, and also take into account subsequent processing steps, it is, moreover, proposed that the adhesive is provided with inorganic and/or organic fillers, as in correspondence with a further preferred embodiment of the method according to the invention.

As already pointed out above, a simple and reliable as well as precise realization of the adhesion will be feasible when using a printable adhesive, wherein, in this context, it is proposed according to a further preferred embodiment that the adhesive is applied by screen-printing, stencil-printing, spread-coating, roll-coating or spin-coating. Such printing methods are known per se and can be accordingly selected, particularly in view of the material properties of the adhesive to be used for the formation of the adhesion according to the invention as well as the layer thicknesses to be obtained and/or the formation of the connection layer of a non-conductive material or dielectric between the rigid portion of the circuit board and the flexible portion of the circuit board.

After having connected the at least one rigid subportion of the circuit board with the flexible portion of the circuit board, a division of the rigid portion of the circuit board is effected by known method steps to form a folding or bending site of the rigid-flexible circuit board to be produced, in order to provide separate rigid, adjacently located subportions, which will subsequently be joined by the flexible portion connected therewith, of the finished rigid-flexible circuit board and ensure, on the site of division, the flexibility respectively desired according to construction demands. The use of hitherto known leaf-shaped layers or films between the rigid subportion and the flexible subportion has not only involved problems in regard to increased layer thicknesses and the registering accuracy to be achieved, but has also called for the proper division of the intermediate layer in the subsequent processing step of dividing the rigid portion of the circuit board, without causing damage or impairment, in particular, to the flexible portion of the circuit board located therebelow.

In order to simplify the subsequent step of dividing the rigid portion of the circuit board for the formation of a bending site over the flexible portion of the circuit board to be connected therewith, it is proposed according to a further preferred embodiment of the method according to the invention that the adhesive is selectively applied in the region of the subsequent division of the rigid portion of the circuit board for the formation of the separate rigid subportions. Such a selective application in the region of the subsequent division will meet the requirements of a simplified process control of the subsequent separation procedure.

In order to ensure the reliable precuring and pre-cross-linking of the second adhesive layer prior to the fixation of the flexible portion of the circuit board and the subsequent complete curing for the final connection with the rigid portion of the circuit board, it is proposed according to a preferred embodiment that the precuring and pre-cross-linking of the second adhesive layer is carried out at temperatures of below 180° C. and, in particular, between about 60° C. and 160° C.

In order to achieve a proper and precisely defined division of the rigid portion of the circuit board, in particular in the region of connection with the flexible portion of the circuit board to be fixed thereto, it is known to form milling edges on the site of the division to be performed subsequently, prior to the connection with the flexible portion of the circuit board. The connection provided by the invention by the aid of an adhesive allows for an enhancement of the positioning accuracy to the extent that on the site of the rigid portion of the circuit board, which is to be divided upon application of the flexible portion of the circuit board, and after having applied an adhesive layer, milling edges are formed over a subregion of the thickness of the rigid portion of the circuit board in a manner known per se, as in correspondence with a further preferred embodiment of the method according to the invention. As already indicated above, it is thereby subsequently feasible to provide a proper division without an excessively precise adjustment of the cutting depth of the rigid portion of the circuit board to be divided, wherein it is proposed in this context according to a further preferred embodiment that, after having fixed the flexible portion of the circuit board to the rigid portion of the circuit board, a division of the rigid portion of the circuit board is effected, departing from the surface of the rigid portion of the circuit board facing away from the milling edges formed, as far as into the region of the adhesive layer provided between the milling edges.

As already mentioned above, multilayer circuit boards have been used to an increasing extent because of the increasing complexity of electronic components or circuits, wherein it is, moreover, preferably proposed according to the invention that a multilayer circuit board is at least used for the rigid portion of the circuit board.

To solve the initially mentioned objects, a rigid-flexible circuit board of the initially defined kind is, moreover, essentially characterized in that a completely cured adhesive layer is provided in the region of the subsequent division of the rigid portion of the circuit board prior to the fixation of the flexible region of the circuit board, which completely cured adhesive layer is adjoined by a partially cured, second adhesive layer which is connectable with the flexible portion of the circuit board to be fixed to the rigid portion of the circuit board. As already indicated above, by providing an adhesive layer for the connection between at least one rigid portion of the circuit board and a flexible portion of the circuit board, a slight layer thickness will be sufficient for said connection, wherein also a registering accuracy is, moreover, achievable by the adhesive connection provided, and, as a result, simplified method steps will, for instance, do to form the division of the rigid portion of the circuit board for the formation of a bending site by the intermediary of the flexible portion of the circuit board and for the provision of appropriate connections between individual conductive layers of the circuit board and, optionally, also between the flexible and rigid portions of the same.

SHORT DESCRIPTION OF THE DRAWINGS

In the following, the invention will be explained in more detail by way of an exemplary embodiment of a method according to the invention for producing a rigid-flexible circuit board according to the invention, which is schematically illustrated in the accompanying drawing. Therein:

Figure 3A:
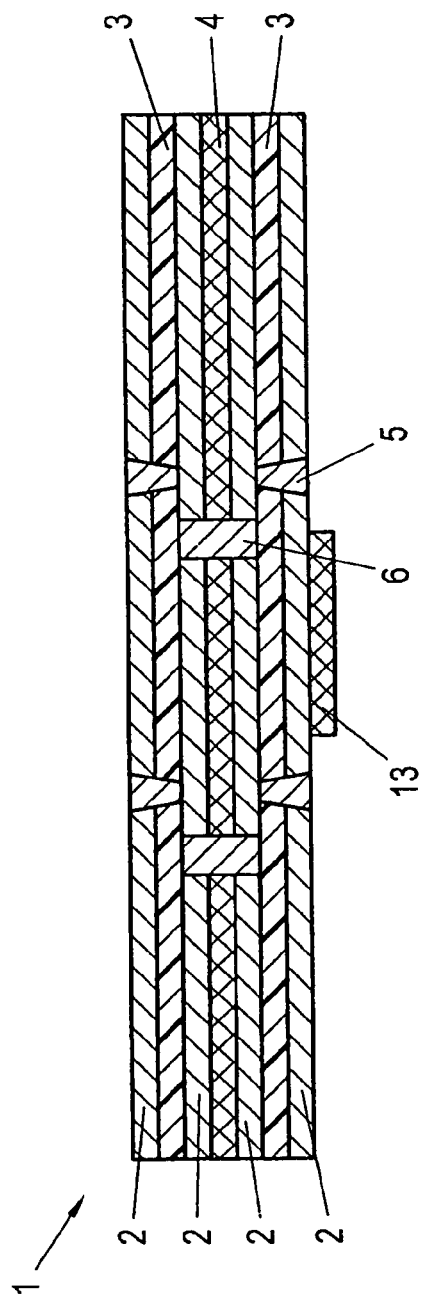
Figure 3B:
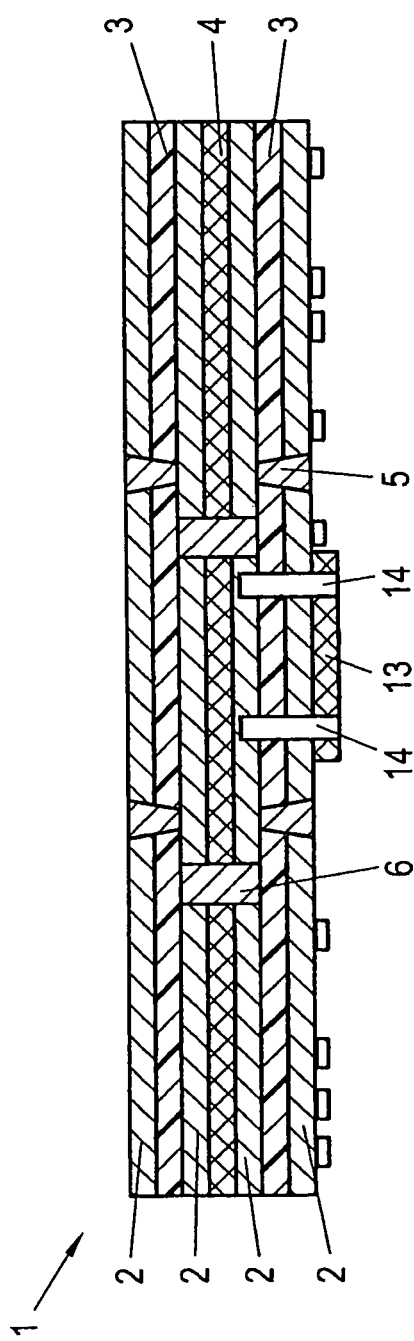
Figure 3C:
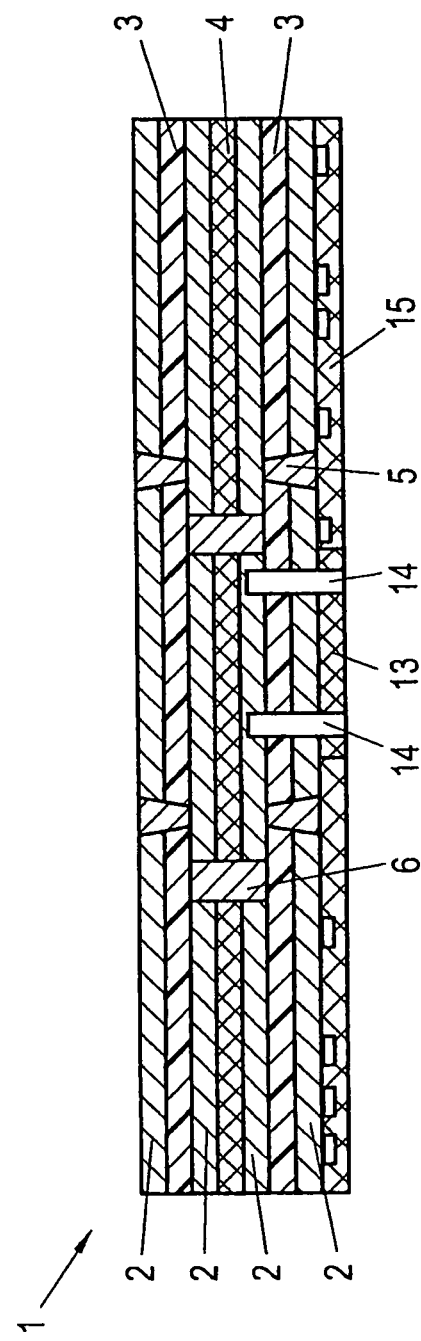

FIG. 3 illustrates the individual method steps of the method according to the invention for producing a rigid-flexible circuit board of the invention; FIG. 3a depicting the application of an adhesive layer in the region of a subsequent division of the rigid portion of the circuit board; FIG. 3b depicting the formation of milling edges in the region of the subsequent division of the rigid portion; FIG. 3c depicting the application of a second adhesive layer adjacent the first adhesive layer in the region of the subsequent division of the rigid portion of the circuit board; FIG. 3d depicting the connection of the rigid portion of the circuit board with the flexible portion of the circuit board; and FIG. 3e depicting the division of the rigid portion of the circuit board for the formation of a bending site following the production of the connection between the rigid portion and the flexible portion of the rigid-flexible circuit board produced according to the invention.

DETAILED DESCRIPTION OF PREFERRED EMBODIMENTS

Figure 1:
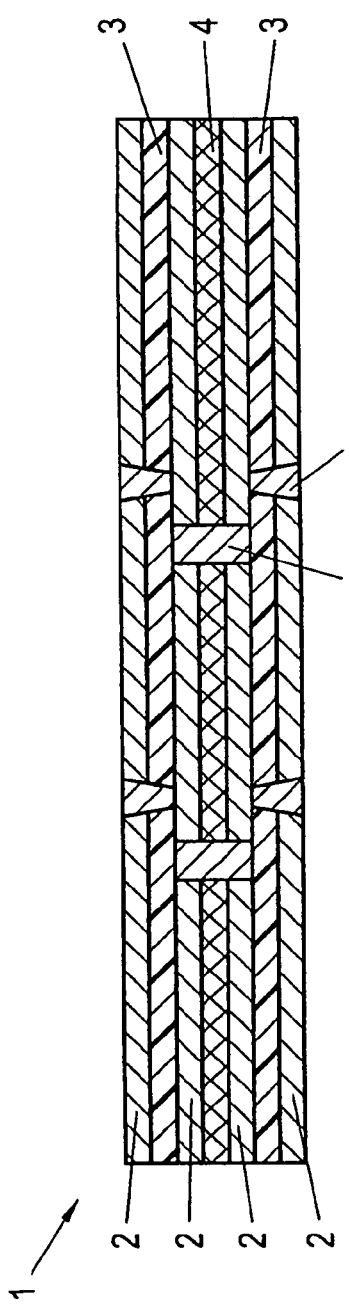
FIG. 1 is a schematic section through an embodiment of a rigid portion of a rigid-flexible circuit board to be produced according to the invention.

FIG. 1 is a schematic illustration of a rigid portion 1 of a rigid-flexible circuit board to be produced subsequently, said rigid portion or zone 1 being multilayered. Copper coats 2 are respectively separated from each other by a prepreg layer 3 and a core 4. Connections between the individual copper layers 2 are indicated via microvias 5 and passages 6, respectively.

Figure 2:
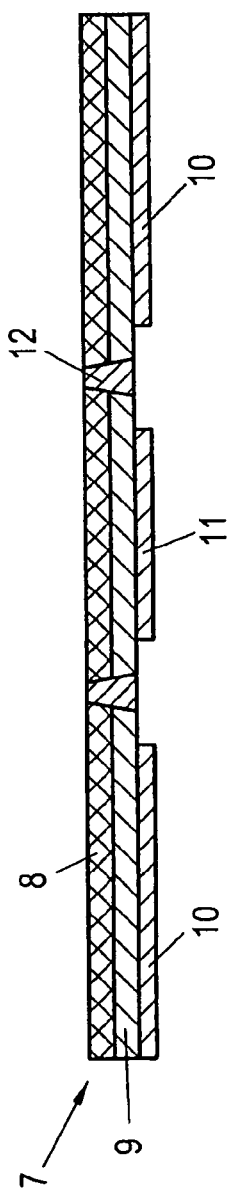
FIG. 2 is a schematic section through an embodiment of a flexible portion of a rigid-flexible circuit board to be produced according to the invention.

FIG. 2 depicts a schematic section through a flexible portion or zone 7 of a rigid-flexible circuit board to be produced, wherein, in addition to a flexible laminate layer 8, a copper layer 9 and solder masks 10 and 11, respectively, are indicated. For a connection to be subsequently formed with subportions of the rigid portion 1 of the circuit board, which are to be connected therewith, microvias or passages 12 are indicated.

In a first method step as in accordance with FIG. 3a, a first adhesive layer 13, which will be completely cured subsequently, is selectively applied on the rigid portion of the rigid-flexible circuit board to be produced, which is again denoted by 1, in a region of a subsequent division of the same, as is, in particular, apparent from FIG. 3e.

After having applied and cured the adhesive layer 13, the formation of milling edges 14 is effected by the step illustrated in FIG. 3b in the region of the division to be performed subsequently of the rigid portion 1 of the circuit board, said milling edges not only passing through the adhesive layer 13, but also through the adjacent layers of the rigid portion 1 of the circuit board.

In a further method step as in accordance with FIG. 3c, a second adhesive layer 15 is subsequently applied on the rigid portion 1 of the circuit board at the region of the first adhesive layer 13 in a substantially identical layer thickness as the adhesive layer 13, said adhesive layer 15 being cured only partially as opposed to the complete curing of the adhesive layer 13.

After this, the rigid portion 1 of the circuit board is connected with the flexible portion 7 of the circuit board by the intermediary of the adhesive layer 15 in the method step illustrated in FIG. 3d, this being effected by a likewise complete curing of the adhesive layer 15.

After having connected the rigid portion 1 of the circuit board with the flexible portion 7 of the circuit board through the adhesion formed by the adhesive layers 15, a division as indicated at 16 is carried out in the region of the previously formed milling edges 14, departing from the end face of the rigid portion 1 facing away from the flexible portion 7, so that accordingly separated subportions or partial zones 17 and 18 of the originally monolithic rigid portion 1 of the circuit board will be connected via the flexible portion 7.

Following the connection formed between the rigid and then separated subportions 17 and 18 of the circuit board and the flexible portion 7, not only the provision or formation of solder masks 19 on the rigid subportions 17 and 18, but also, for instance, the creation of a feedthrough between the conductive copper layer 9 of the flexible portion 7 of the rigid-flexible circuit board to be produced and a first copper layer 2 of the rigid subportions 17 and 18 are effected, as indicated at 20.

By the method control represented in FIG. 3, it is feasible, by providing two different adhesive layers 13 and 15, to carry out a simple division in the dividing step illustrated in FIG. 3e, in particular also in consideration of the previously produced milling edges 14, without having to observe extremely narrow tolerances in terms of the thickness of the adhesive layer to be provided, since, due to the precuring of the adhesive layer 13 in the region of the subsequent division, no direct adherence of the latter to the circuit board flexible portion 7 to be fixed subsequently will be obtained. It is, moreover, apparent from the illustration according to FIGS. 3b to 3e that, due to the slightly larger dimension of the first adhesive layer 13 relative to the arrangement of the division 16 defined by the milling edges 14, any penetration of the adhesive or adhesive layer 15 while forming the connection with the flexible portion 7 of the circuit board will be prevented.

In the method control discussed by way of FIG. 3, an identical adhesive is, for instance, used for the adhesive layers 13 and 15, whereby subsequent binding with the flexible portion 7 of the circuit board, which is to be fixed thereto, will be avoided because of the complete premature curing of the adhesive layer 13.

By observing temperatures of below 180° C. and, in particular, between about 60° C. and 160° C., for the precuring and pre-cross-linking of the second adhesive layer 15, a suitable prearrangement for the subsequent connection with the flexible portion 7 is, moreover, provided.

Instead of using a substantially identical adhesive for the adhesive layers 13 and 15, and different pre-treatments prior to the fixation of the flexible portion 7 of the circuit board, the use of different adhesives for the production of the adhesive layers 13 and 15 may, of course, also be provided, wherein, for the subsequent, simple formation of a division 16 in the rigid portion 1 of the circuit board, it is to be taken care that, as in the exemplary embodiment represented in FIG. 3, a weaker and, favourably, completely lacking adherence to the flexible portion 7 will be obtained at the subsequent fixation so as to ensure simpler removal of the adhesive in the region of the division 16 to be produced.

The adhesive layers 13 and 15, in particular as a function of the adhesive material used, can be applied in the respectively desired, slight thicknesses and with the required accuracy for a subsequent registration or alignment, for instance, by screen-printing, stencil-printing, spread-coating, roll-coating or spin-coating. By using such application methods known per se and, in particular, printing techniques for forming the adhesive layers, an accordingly small layer thickness of, in particular, less than 50 µm and, particularly preferred, less than 40 µm will do.

By using an adhesion between the rigid portion 1, or 17 and 18 of the circuit board and the flexible portion 7 of the circuit board, it will, for instance, be additionally feasible in a simple manner to take into account legal limitations required when using specific hazardous substances in electric and electronic equipment. Moreover, the use of an adhesive having an accordingly low thermal expansion coefficient will be enabled so as to further simplify the processing steps.

Through the use of an adhesive connection between the rigid subportions 17 and 18 and the flexible portion 7 of the rigid-flexible circuit board, it has become feasible, in particular in consideration of the slight layer thickness achievable for the connection layer and the thus resulting enhancement of the registering accuracy, to provide printed circuit boards with flexible layers for highly complex components even in large formats, for instance in the production format of HDI circuit boards of more than 18×24 inch.

By providing an accordingly small layer thickness by applying an adhesive layer of, in particular, less than 40 µm, no active flame retardation will, moreover, be required.

As already pointed out several times, simple methods for applying the adhesive layer(s) will do, whereby such adhesive layers can also be applied in an accordingly exact and highly precise manner so that additional processing steps such as, e.g., punching steps for preparing suitable leaf-shaped films as in accordance with the prior art can be obviated. Due to the simplification of the process control, in particular by the use of printable adhesives, and hence the simplification of the overall method, ways of achieving time and cost savings in the production of rigid-flexible circuit boards are additionally provided.

The embodiment illustrated in FIG. 1, of a rigid multilayer circuit board represents a simplified example of such a circuit board merely for illustration purposes, wherein it is, of course, also possible to use a larger number or plurality of, in particular, conductive layers 2 and feedthroughs or microvias 5, as a function of the desired complexity of the component to be produced.

The invention claimed is:

1. A method for producing a rigid-flexible circuit board, wherein at least one rigid portion or zone of a printed circuit board is connected with at least one flexible portion or zone of the printed circuit board via a layer of non-conductive material or dielectric layer, the method comprising the steps of:
   selectively applying a first adhesive layer on a rigid portion of the rigid-flexible circuit board in a region where a subsequent division is made;
   completely curing the first adhesive layer;
   applying a second adhesive layer on the rigid portion of the rigid-flexible circuit board in a region not covered by the first adhesive layer, the second adhesive layer is in an identical thickness as the first adhesive layer;
   partially curing the second adhesive layer; and
   connecting the rigid portion of the rigid-flexible circuit board with the flexible portion of the rigid-flexible circuit board through the second adhesive layer;
   wherein different regions of the first and second adhesive layers are comprised of an identical adhesive material.

2. The method according to claim 1, wherein the adhesion between the rigid and flexible portions of the circuit board is made using a printable adhesive.

3. The method according to claim 1, wherein the layer thickness of the adhesion is chosen to be smaller than 50 µm.

4. The method according to claim 1, wherein a one- or multi-component thermosetting cross-linking adhesive is used.

5. The method according to claim 4, wherein the adhesive is selected on the basis of epoxides, polyimides, phenol resins or mixtures thereof.

6. The method according to claim 1, wherein the adhesive is provided with inorganic or organic fillers.

7. The method according to claim 1, wherein the adhesive is applied by screen-printing, stencil-printing, spread-coating, roll-coating or spin-coating.

8. The method according to claim 1, wherein the adhesive is selectively applied in the region of the subsequent division of the rigid portion of the circuit board for the formation of the separate rigid subportions.

9. The method according to claim 1, wherein the precuring and pre-cross-linking of the second adhesive layer is carried out at temperatures of below 180° C.

10. The method according to claim 1, wherein on the site of the rigid portion of the circuit board, which is to be divided upon application of the flexible portion of the circuit board, and after having applied an adhesive layer, milling edges are formed over a partial region of the thickness of the rigid portion of the circuit board.

11. The method according to claim 10, wherein, after having fixed the flexible portion of the circuit board to the rigid portion of the circuit board, a division of the rigid portion of the circuit board is effected departing from the surface of the rigid portion of the circuit board, that faces away from the formation of the milling edges as far as into the region of the adhesive layer provided between the milling edges.

12. The method according to claim 1, wherein a multilayer circuit board is at least used for the rigid portion of the circuit board.

13. The method according to claim 1, wherein the layer thickness of the adhesion is chosen to be smaller than 40 μm.

14. The method according to claim 1, wherein the precuring and pre-cross-linking of the second adhesive layer is carried out at temperatures of between 60° C. and 160° C.

15. The method according to claim 4, wherein the adhesive is selected on the basis of epoxides, polyimides, phenol resins or mixtures thereof, in combination with curing systems based on hydroxyl-, thiol- or amino-functional cross-linking groups.

* * * * *

UNITED STATES PATENT AND TRADEMARK OFFICE
CERTIFICATE OF CORRECTION

| | | |
|---|---|---|
| PATENT NO. | : 8,500,938 B2 | Page 1 of 1 |
| APPLICATION NO. | : 12/449608 | |
| DATED | : August 6, 2013 | |
| INVENTOR(S) | : Johannes Stahr et al. | |

It is certified that error appears in the above-identified patent and that said Letters Patent is hereby corrected as shown below:

On the title page, Item (73) Assignee should read: --AT & S Austria Technologie & Systemtechnik Aktiengesellschaft, Leoben-Hinterberg (AT)--

Signed and Sealed this
Fifteenth Day of October, 2013

Teresa Stanek Rea
*Deputy Director of the United States Patent and Trademark Office*